United States Patent [19]

Okubo

[11] Patent Number: 4,752,752
[45] Date of Patent: Jun. 21, 1988

[54] NOISE FILTER

[75] Inventor: Akira Okubo, Takefu, Japan

[73] Assignee: Murata Manufacturing Co., Ltd., Nagaokakyo, Japan

[21] Appl. No.: 916,392

[22] Filed: Oct. 7, 1986

[51] Int. Cl.$^4$ .............................................. H03H 7/00
[52] U.S. Cl. ..................................... 333/181; 333/185
[58] Field of Search ................. 333/167, 181, 185, 12, 333/172; 361/401, 404, 406, 409

[56] References Cited

U.S. PATENT DOCUMENTS

| 2,270,169 | 1/1942 | Muller | 333/185 X |
| 4,110,715 | 8/1978 | Reindel | 333/185 X |
| 4,320,364 | 3/1982 | Sakamoto et al. | 333/167 |
| 4,485,382 | 11/1984 | Moore | 333/185 X |
| 4,603,373 | 7/1986 | Lavene | 361/404 X |

FOREIGN PATENT DOCUMENTS 0138913 10/1980 Japan .................................. 333/185

Primary Examiner—Eugene R. Laroche
Assistant Examiner—Seung Ham
Attorney, Agent, or Firm—Wenderoth, Lind & Ponack

[57] ABSTRACT

A noise filter has a substrate having main surfaces on opposite sides thereof and of a material capable of electrically isolating elements on the surfaces thereof, an input electrode on one main surface of the substrate, an output electrode on the one main surface of the substrate and spaced from the input electrode, an intermediate electrode on the one main surface of the substrate and having one end spaced from the input electrode and the other end spaced from the output electrode, the intermediate electrode having a reentering angle portion at a position along the length thereof between the input electrode and the output electrode, an inductance element connected between the input electrode and the end of the intermediate electrode spaced therefrom an a further inductance element connected between the output electrode and the end of the intermediate electrode spaced therefrom, a ground electrode on a main side of the substrate adjacent the reentering angle portion, and a capacitor between the reentering angle portion and the ground electrode.

7 Claims, 2 Drawing Sheets

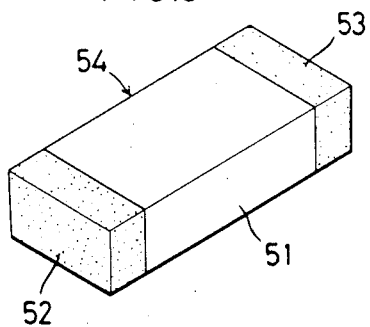
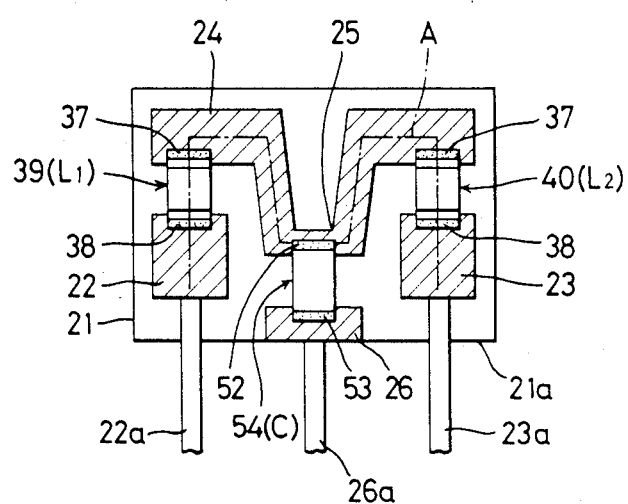

NOISE FILTER

The present invention relates to a noise filter provided at one substrate with a capacitor element and inductance elements.

Prior art noise filters have a structure which develops residual inductance $L_0$ in such a way that useless noises are restrained from flowing to ground, and the resonnance frequency of the capacitor element C and residual inductance $L_0$ is reduced, thereby creating the problem that the high frequency characteristic of the noise filter is deteriorated.

An object of the invention is to provide a noise filter which causes residual inductance to be developed on the signal line, the residual inductance being allowed to function to remove the noises, thereby enabling the noise attenuation at the high frequency to increase.

Another object of the invention is to provide a noise filter which can effectively cause noises to flow to ground through a capacitor element, thereby enabling the high frequency characteristic to be greatly improved.

These and other objects and features of the invention will be seen by reference to the description, taken in connection with the accompanying drawings.

BRIEF DESCRIPTION OF THE DRAWINGS

FIG. 5 is a perspective view of a multi-layered chip capacitor as a capacitor which serves element; and FIG. 6 is a front view of a modified embodiment of the noise filter of the invention.

DETAILED DESCRIPTION OF THE INVENTION

Figure 1:
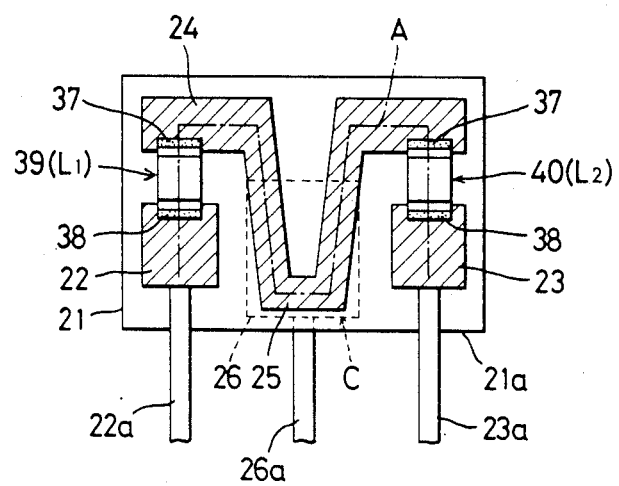
FIG. 1 is a front view of an embodiment of a noise filter of the invention.

Referring to FIG. 1, a substrate 21 comprises a rectangular dielectric substrate formed of barium titanate or the like and is provided at one main surface with an input electrode 22, an output electrode 23 and an intermediate electrode 24.

The input electrode 22 and output electrode 23 are disposed close to the corners at the ends of edge 21a at which the dielectric substrate 21 is mounted on a printed circuit board or the like, and the intermediate electrode 24 is disposed so as to be spaced at the respective ends from the input electrode 22 and output electrode 23 to form gaps across which inductance elements $L_1$ and $L_2$ are mounted on the substrate 11 respectively, and is provided at an intermediate portion with a reentering angle portion 25.

Between one end of the intermediate electrode 24 and the input electrode 22 and between the other end of the same and the output electrode 23 are mounted inductance elements $L_1$ and $L_2$ in the form of chip coils 39 and 40 each formed of a coil 34 wound around a core 33 sandwiched between a pair of flanges 31 and 32 and serving as the inductance elements, the ends of the coil 34 being connected by lead wires 35 and 36 by soldering or the like with electrodes 37 and 38 formed on the bottom face of one flange 31 on the chip coil mounting side. The chip coils 39 and 40, as shown in FIG. 1, are interposed between the ends of the intermediate electrode 24 and the input electrode 22 and output electrode 23 respectively, the electrodes 37 and 38 of the respective chip coils 39 and 40 being connected electrically with the intermediate electrode 24, input electrode 22 and output electrode 23 by soldering or the like respectively.

Figure 4:
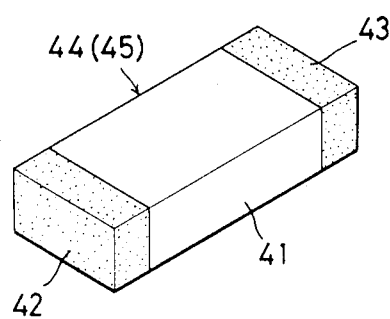
FIG. 4 is a perspective view of another chip coil which serves as the inductance element.

Alternatively, such inductance elements $L_1$ and $L_2$ may, as shown in FIG. 4, be chip coils 44 and 45 each comprising a laminated member 41 which has alternately stacked magnetic material sheets and conductive material layers with the conductive material layers being connected with each other to form a coil, the laminated member 41 having at both end faces and part of the outer periphery external electrode 42 or 43 connecting with one end of each conductive material layer.

It is a preferable that the reentering angle portion 25 of the intermediate electrode 24 projects at its central portion close to one said edge 21a at the dielectric substrate 21 mounting side.

In addition, the reentering angle portion 25, which has a V-like shape as shown, is not limited to such shape, but may be, for example, U-like-shaped.

On the other main surface of the dielectric substrate 21, a ground electrode 26 is provided at least at the position opposite to the reentering angle portion 25 of the intermediate electrode 24 through the dielectric substrate 21, and a capacitor element C is formed between the reentering angle portion 25 and the ground electrode 26.

Incidentally, the input electrode 22, output electrode 23 and ground electrode 26 are soldered to one ends of lead terminals 22a, 23a and 26a and the other ends thereof extend out from the edge of the dielectric substrate 21 for mounting it on a printed circuit board or the like.

In the embodiment in FIG. 1, the capacitor element C is formed between the reentering angle portion 25 of the intermediate electrode 24 and the ground electrode 26 provided on the opposite main surfaces of the dielectric substrate 21. Alternatively, the capacitor element C may be a multi-layered chip capacitor 54, for example, as shown in FIG. 5, the multi-layered chip capacitor 54 comprising a laminated member 51 of alternately stacked dielectric material sheets and conductive material layers and having at both end faces and part of the outer periphery of the laminated member 51 external electrodes 52 and 53 connected electrically with one end of each conductive layer, and the multi-layered chip capacitor 54 can be disposed between the reentering angle portion 25 at the intermediate electrode 24 and the ground electrode 26.

In this case, as shown in FIG. 6, ground electrode 26 is provided on the one main surface of an insulating substrate 21 formed of alumina or the like spaced from the reentering angle portion 25 of the intermediate electrode 24 at a predetermined interval and close to the edge 21a of the insulating substrate 21 on the side which is to be mounted on the printed board, so that the electrodes 52 and 53 of the multi-layered chip capacitor 54 need only be connected by soldering or the like with the intermediate electrode 24 and ground electrode 26 respectively, the multi-layered chip capacitor 54 being disposed between the reentering angle portion 25 of the intermediate electrode 24 and the ground electrode 26.

Otherwise, the embodiment shown in FIG. 6 is similar in construction and circuit to that shown in FIG. 1, so that explanation is given only of the differences, and the same components are designated by the same reference numerals and an explanation therefore is omitted.

Figure 2:
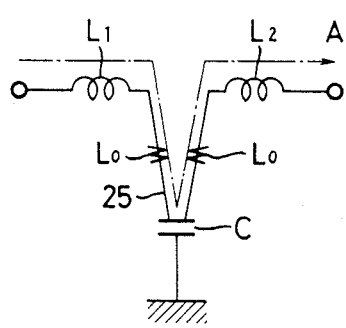
FIG. 2 is an equivalent circuit diagram thereof.
Figure 3:
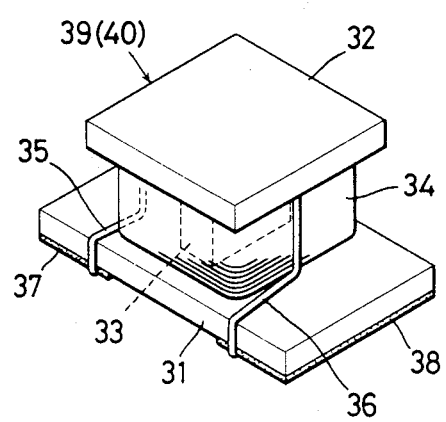
FIG. 3 is a perspective view of a chip coil which serves as an inductance element.

The noise filter of the present invention constructed as above-described is provided in the intermediate electrode 24 with the reentering angle portion 25 so that the signal line A is elongated and the residual inductance $L_0$, as shown in the equivalent circuit in FIG. 2, generated along the intermediate electrode 24 is developed on the signal line A, thereby functioning to eliminate noises.

Moreover, the central portion of the roundabout portion 25 is close to the one edge 21a of the substrate 21 so as to reduce the residual inductance on the bypass to ground, thereby enabling the noises to effectively flow to ground through the capacitor element C.

Accordingly, upon introducing the signal into the input electrode 22, the inductance elements $L_1$ and $L_2$ mounted between the ends of intermediated electrode 24 and the input electrode 22 and output electrode 23 reduce useless noise of high frequency and then the capacitor element C bypasses it toward the ground.

At this time, since the intermediate electrode 24 has at an intermediate portion thereof the reentering angle portion 25 and the capacitor element C is provided between the reentering angle portion 25 and the ground electrode 26, the residual inductance $L_0$ is developed on the signal line A so as to function to reduce the noises and the capacitor element C can reliably bypass the useless noises toward ground, thereby greatly improving the high frequency characteristic of the filter.

Although several embodiments have been described, they are merely exemplary of the invention and not to be constructed as limiting, the invention being defined solely by the appended claims.

I claim:

1. A noise filter comprising:
   a substrate having main surfaces on opposite sides thereof and of a material capable of electrically isolating elements on the surfaces thereof, and having an edge;
   an input electrode adjacent said edge on one main surface of said substrate;
   an output electrode adjacent said edge on said one main surface of said substrate and spaced from said input electrode;
   an intermediate electrode on said one main surface of said substrate and having one end spaced from said input electrode and the other end spaced from said output electrode, said intermediate electrode having a reentering angle portion at a position along the length thereof between said input electrode and said output electrode and having an outer end adjacent said edge;
   an inductance element connected between said input electrode and the end of said intermediate electrode spaced therefrom and a further inductance element connected between said output electrode and the end of said intermediate electrode spaced therefrom;
   a ground electrode on a main side of said substrate adjacent said reentering angle portion; and
   a capacitor means between said reentering angle portion and said ground electrode.

2. A noise filter as claimed in claim 1 in which said reentering angle portion has a V-shape.

3. A noise filter as claimed in claim 1 in which said inductance elements are each a chip coil.

4. A noise filter as claimed in claim 1 in which said substrate is a dielectric material.

5. A noise filter as claimed in claim 4 in which said ground electrode is on the other main surface of said substrate opposite the outer end of said reentering angle portion, and said capacitor means is the dielectric material between said ground electrode and said reentering angle portion.

6. A noise filter as claimed in claim 1 in which said substrate is an electrically insulating material.

7. A noise filter as claimed in claim 6 in which said ground electrode is on said one main surface of said substrate spaced from said reentering angle portion, and said capacitor means is a multi-layered chip capacitor connected between said reentering angle portion and said ground electrode.

* * * * *